United States Patent [19]

Fielding et al.

[11] Patent Number: 4,588,664

[45] Date of Patent: May 13, 1986

[54] PHOTOPOLYMERIZABLE COMPOSITIONS USED IN HOLOGRAMS

[75] Inventors: Herbert L. Fielding, Wilmington; Richard T. Ingwall, Newton, both of Mass.

[73] Assignee: Polaroid Corporation, Cambridge, Mass.

[21] Appl. No.: 641,993

[22] Filed: Aug. 20, 1984

Related U.S. Application Data

[63] Continuation-in-part of Ser. No. 526,156, Aug. 24, 1983, abandoned.

[51] Int. Cl.$^4$ .................. G03C 1/70; G03C 9/08; G03G 1/04
[52] U.S. Cl. ............................. 430/1; 430/2; 430/281; 430/919; 430/926; 430/327; 430/331; 430/945; 522/4; 522/25; 522/28; 522/120; 522/182; 427/12; 427/531
[58] Field of Search ............... 430/1, 2, 281, 919, 430/926, 945, 327, 331; 204/159.15, 159.23

[56] References Cited

U.S. PATENT DOCUMENTS

| | | | |
|---|---|---|---|
| 3,097,097 | 7/1963 | Oster et al. | 204/159.14 |
| 3,445,229 | 5/1969 | Webers | 430/286 X |
| 3,531,281 | 9/1970 | Rust | 96/48 |
| 3,573,922 | 4/1971 | Rust | 96/115 |
| 3,597,204 | 8/1971 | Rust | 96/45.2 |
| 3,649,495 | 3/1972 | Rust | 204/159.24 |
| 3,658,526 | 4/1975 | Haugh | 96/27 |
| 3,694,218 | 9/1972 | Margerum et al. | 96/35.1 |
| 3,925,082 | 12/1975 | Fielding et al. | 96/76 R |
| 3,963,806 | 6/1976 | Dornte | 528/392 X |
| 4,036,647 | 7/1977 | Brault et al. | 96/76 C |
| 4,173,474 | 11/1979 | Tanaka et al. | 430/2 X |
| 4,340,057 | 7/1982 | Bloch et al. | 427/44 X |

FOREIGN PATENT DOCUMENTS

| | | | |
|---|---|---|---|
| 51-41518 | 4/1976 | Japan | 430/919 |
| 75922 | 9/1977 | Poland . | |
| 924238 | 4/1963 | United Kingdom . | |

OTHER PUBLICATIONS

Jaronir Kosar, Chapter 5, "Photopolymerization Processes", *Light-Sensitive Systems: Chemistry and Application of Nonsilver Halide Photographic Processes* (John Wiley & Sons, New York, N.Y. 1965) pp. 158–193.

Jacobson and Jacobson, *Imaging Systems*, Chapter X, pp. 181–222, John Wiley & Sons, N.Y., N.Y. (1976).

J. A. Jenney, "Holographic Recording with Photopolymers", *Journal Optical Society of America*, vol. 60, pp. 1155–1161, Sep. 1970.

J. D. Margerum et al., "Studies on the Mechanism of Dye-Sensitized Photopolymerization Initiation", *Polymer Preprints for the 160th American Chemical Society Meeting*, Chicago, Ill., Sep. 15, 1970, pp. 634–644.

Sugawara, et al. "Holographic Recording by Dye-Sensitized Photopolymerization of Acrylamide", *Applied Optics*, vol. 14, Feb. 1975, pp. 378–382.

Dow Chemical Company, "Montrek Polyethylenimine Products", Midland, Michigan, pp. 1–19.

Martha Windholtz et al. (Eds.) *The Merck Index* (9th Ed.) (Merck & Co. Inc., Rahway, N.J. 1976) Reference No. 7993 and 7994, pp. 1064–1065.

Shungo Sugawara "Dye-Sensitized Photopolymerizable Materials for Holographic Recording", *Review of the Electrical Communication Laboratories*, vol. 24, Numbers 3–4, Mar.-Apr., 1976, pp. 301–308.

*Chemical Abstracts*, vol. 90 (1979), p. 657, Abstract No. 90:178194n.

*Primary Examiner*—John E. Kittle
*Assistant Examiner*—Cynthia Hamilton

[57] ABSTRACT

Novel photopolymerizable compositions are provided which comprise a dye sensitizer, a branched polyethylenimine as a polymerization initiator and a free radical polymerizable ethylenic unsaturated monomer.

In the preferred embodiments, the branched polyethylenimine is used in combination with lithium acrylate. This combination provides dry coatings which may be stored for extended periods prior to being activated for imaging, and which produce volume holograms of very high resolution and diffraction efficiency.

37 Claims, No Drawings

PHOTOPOLYMERIZABLE COMPOSITIONS USED IN HOLOGRAMS

This application is a continuation-in-part of copending application Serial No. 526,156 filed Aug. 24, 1983 (now abandoned).

This application is concerned with photography and, more particularly, with novel photopolymerizable materials. The photopolymerizable materials provided by this invention are particularly adapted for use in forming holograms.

BACKGROUND OF THE INVENTION

Photopolymerization is a process which leads to the formation of a polymer from monomeric molecules. Many photopolymerizable materials are known in the art, and have been used to form resist and other types of images.

A good review of photopolymerization processes appears in Chapter X of *Imaging Systems,* Jacobson and Jacobson, John Wiley & Sons, N.Y., N.Y., pp. 181–222 (1976). Dye-sensitized photopolymerization systems are discussed in some detail; see, for example, pp. 184, 195–197, and 214–216. A wide variety of ethylenic unsaturated monomers are noted as useful in such systems. The use of methylene blue as a dye sensitizer in combination with sodium p-toluene sulfinate as a polymerization initiator is noted as a particularly useful photopolymerization initiation system with barium diacrylate and acrylamide, and such a photopolymerizable composition also is noted as useful as a holographic recording material. U.S. Pat. No. 3,694,218 issued to Margerum et al on Sept. 26, 1972 describes the formation of holograms using a similar photopolymerization system comprising, e.g., barium diacrylate, lead diacrylate, acrylamide, methylene blue, p-toluenesulfinic acid sodium salt and 4-nitrophenylacetic acid sodium salt.

Other polymerization initiators disclosed in said U.S. Pat. No. 3,694,218 include triorgano phosphines, triorgano arsines and other organic sulfinic compounds. Similar disclosures of polymerization initiators appear in U.S. Pat. No. 3,573,922 issued Apr. 6, 1971 and U.S. Pat. No 3,649,495 issued Mar. 14, 1972, both in the name of Rust.

Photopolymerization systems of the type described in the aforementioned Margerum and Rust patents are liquids, and are used by being placed between glass slides spaced apart to form a thin cell. The addition of a film-forming thickener to increase viscosity or to form a film has been proposed in U.S. Pat. No. 3,594,204 issued Aug. 3, 1971 to Rust; examples of proposed polymeric thickeners include gelatin, polyvinyl alcohol, polyvinylpyrrolidone and cellulosic compounds. A similar disclosure appears in U.S. Pat. No. 3,531,281 issued Sept. 29, 1970 to Rust, wherein the addition of polyvinyl pyrrolidone is said to be for the purpose of adding viscosity to the solution so that it would form a more satisfactory film on glass. U.S. Pat. No. 3,658,526 issued Apr. 25, 1972 to Haugh discloses the addition of a variety of polymers to form photopolymerizable films using monomers having a boiling point above 100° C.

The formation of phase holograms by photopolymerization using barium diacrylate in combination with methylene blue and p-toluene sulfinic acid is discussed at some length by Jenney in an article "Holographic Recording with Photopolymers", *Journal Optical Society of America,* Vol. 60, pp. 1155–1161, September 1970.

Margerum et al have reported on a number of "catalysts" or polymerization initiators used in combination with methylene blue and acrylamide in a paper "Studies on the Mechanism of Dye-sensitized Photopolymerization Initiation", *Polymer Preprints for the 160th American Chemical Society Meeting, Chicago, Ill. Sept.* 15, 1970, pp. 634–644. In some instances, a mixture of acrylamide and barium diacrylate was used. Margerum et al concluded that the sulfinate ions were far superior to such other catalysts as triethanolamine and ethylenediamine tetraacetic acid (EDTA). Sugawara et al *(Applied Optics, Vol.* 14, February, 1975; pp. 378–382) have reported on the use of acetylacetone and triethanolamine as initiators with acrylamide and methylene blue.

It has been recognized that such photopolymerization systems generally have limited shelf lives—sometimes only a few hours—even though the monomers and photocatalyst systems individually have long shelf lives; note Jenney, supra, p. 1155 and Sugawara et al, supra, pp. 378 and 382. For this reason, the art has taught that the components should be mixed and coated just prior to use. Indeed, U.S. Pat. No. 4,036,647 issued July 19, 1977 to Brault et al proposes a structure in which part of photopolymerizable composition is coated on a support while the remaining components are contained in a liquid stored in a rupturable container or pod. Rupture of the pod and distribution of the liquid between said coated support and a second element forms the photopolymerizable composition in situ immediately prior to use.

U.S. Pat. No. 4,173,474 issued Nov. 6, 1979 in the name of Tanaka et al. discloses the formation of holograms by the photopolymerization of a monomer, e.g., barium acrylate, in a carrier polymer, e.g., gelatin, followed by immersion in one or more solvents such as isopropanol. Tanaka et al mention polyethylenimine and polyvinyl pyrrolidone in a long list of alternative polymers suitable for use as the carrier polymer; note col. 3, line 67 to col. 4, line 19. The carrier polymer is selected on the basis of its swellability when contacted by a solvent after photopolymerization; see col. 2, lines 23–25. There is no white light exposure to fix the laser exposed coating. The patent does not disclose or suggest applicants' discovery that branched polyethylenimine is an active participant in dye sensitized photopolymerization of ethylenic unsaturated monomers. Moreover, Tanaka et al neither disclose nor suggest the use or special properties of lithium acrylate as the photopolymerizable monomer.

SUMMARY OF THE INVENTION

In accordance with the present invention, novel dye-sensitized photopolymerizable compositions are provided which utilize a branched polyethylenimine as the polymerization initiator.

In the preferred embodiments of this invention, the photopolymerizable monomer is lithium acrylate and the photopolymerizable composition is coated on a support to provide a photosensitive element exhibiting extended shelf life.

DETAILED DESCRIPTION OF THE INVENTION

It has been found that a branched polyethylenimine is a highly effective initiator of dye-sensitized photopolymerization. As used herein, "branched polyethylenimine" is intended to designate polyethylenimines containing tertiary nitrogen atoms (tertiary amine groups).

Examples of such branched polyethylenimines are those having the formula

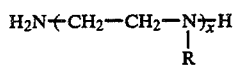

wherein R is

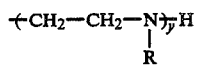

Such branched polyethylenimines have the CAS No. 9002-98-6 and are commerically available from Cordova Chemical Co. of Michigan, North Muskegon, Mich., under the tradename "Corcat". Branching during polymerization is reported to lead to approximately 30% primary, 40% secondary and 30% tertiary amines.

Derivatized polyethylenimines which contain tertiary nitrogens also are suitable, e.g., hydroxyethylated polyethylenimines such as that commercially available from Dow Chemical Co., Midland, Mich. under the tradename "PEI 600E" and said to have the formula:

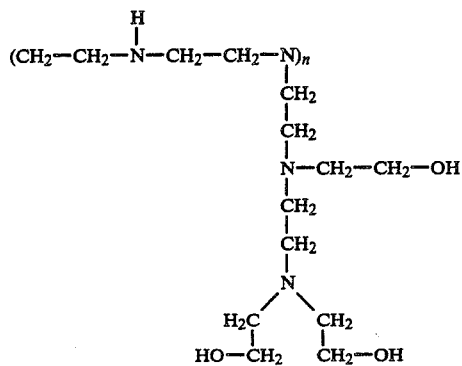

Other useful branched polyethylenimines may be prepared by derivatizing linear or branched polyethylenimine.

Linear polyethylenimine, such as that sold by Dow Chemical Co. and prepared by hydrolyzing polyethyloxazoline, however, has been found ineffective as a photopolymerization initiator.

While applicants do not wish to be bound by any theory, it is believed that light absorption by the dye sensitizer changes it to the excited triplet stage, and the thus excited dye sensitizer extracts a proton from a carbon atom adjacent to a tertiary nitrogen of the branched polyethylenimine to form a free radical which is the active polymerization initiator.

The concentration of tertiary nitrogens provided by the branched polyethylenimine is not critical, provided it is sufficient to obtain the desired rate of polymerization. In general, it is preferred that at least 20% of the nitrogens be tertiary. Routine experimentation may be used to determine appropriate concentrations for a given system.

A wide variety of ethylenic unsaturated monomers may be used in dye-sensitized photopolymerization systems using a branched polyethylenimine polymerization initiator. The particular monomer will be selected according to the type of image and image properties desired. Anionic monomers such as acrylic acid monovalent salts are preferred, since the polyanion formed by polymerization may complex with the branched polyethylenimine polycation. Sodium acrylate, ammonium acrylate and lithium acrylate are examples of such monomers.

Lithium acrylate is the preferred polymerizable monomer and, indeed, has been found to give unique results (as discussed in detail, infra), even as compared with sodium acrylate, when used in combination with a branched polyethylenimine.

The polymerizable ethylenic unsaturated monomers employed in the practice of this invention may, and normally do (especially as obtained commercially), contain a minor amount of a polymerization inhibitor to prevent spontaneous thermally induced polymerization before polymerization is desired. A preferred inhibitor is p-methoxyphenol, although others well known in the art may be used. The presence of a small amount of such an inhibitor is not a problem in the practice of this invention.

The dye or photosensitizer is selected to correspond to the wavelength or wavelength range which it is desired to record. Where a hologram is the intended product, the photosensitizer is selected on the basis of the laser which will be employed in making the holographic exposure. In general, images may be recorded over the entire visible wavelength range as well as in the ultraviolet and infrared regions by using a dye sensitizer absorbing at the desired wavelength(s). (It is recognized that dye sensitizers absorbing in the ultraviolet and infrared may exhibit little, if any, visible absorption and therefore may appear to be colorless. The term "dye sensitizer" is intended to include such colorless light absorbers as well as those which are colored.)

A particularly useful dye sensitizer for use in combination with a branched polyethylenimine is methylene blue. Other useful dye sensitizers include erythrosin, eosin Y and riboflavin-5-phosphate. Combinations of dye sensitizers also may be used, particularly dyes which will absorb radiation not efficiently absorbed by methylene blue but which upon absorbing radiation will emit radiation of a wavelength absorbed by methylene blue, thereby activating the methylene blue. The combination of methylene blue and a branched polyethylenimine is preferred, since this combination has been found to give increased light sensitivity permitting shorter exposures. Other useful dye sensitizers may be identified by routine experimentation among the various compounds known in the literature for this purpose. The dye sensitizer concentration may be determined by routine tests as a function of the particular polymerization system components and the desired polymerization rate for the particular application.

The photopolymerizable compositions provided by this invention may be used in the form of solutions or fluids disposed between spaced-apart glass slides. Such techniques are well known in the art, and are described, for example, in the above-noted patents and articles in the names of Rust, Margerum and Jenney. The polymerizable monomer or mixture of monomers preferably is selected to provide a clear solution with the dye sensitizer and the branched polyethylenimine, as such clear compositions yield higher resolution. It will be understood, however, that combinations may be used wherein a monomer or other component is not completely dissolved if the loss of resolution caused by the resultant light scattering is acceptable for the intended use. Certain combinations which provide clear solutions or "fluids" may if coated to form a film give a hazy film due to precipitation or other type of phase change; where high resolution is desired, such photopolymerizable compositions are preferably used in the fluid form.

As noted above, the prefered embodiment of this invention comprises the combination of lithium acrylate, a dye sensitizer, and a branched polyethylenimine, and particularly such a combination together with poly-N-vinyl pyrrolidone. In general, the lithium acrylate will be present in a stoichiometric excess based upon the total nitrogens of the branched polyethylenimine. Tn the preferred embodiments, lithium acrylate comprises about 50% by weight of the coated film. If the lithium acrylate is prepared as the monohydrate; it is advantageous to convert it to the anhydrous form prior to forming the coating fluid to minimize the amount of water therein.

The above-noted preferred embodiment using lithium acrylate has been found to permit the formation of dry, clear films which have a long shelf life. The resulting film has high sensitivity as a photopolymerizable material, and produces very high resolution volume phase holograms, both transmission and reflection.

As noted above, the use of lithium acrylate in combination with a branched polyethylenimine, especially when poly-N-vinyl pyrrolidone also is present, has been found to give dry, clear films. In contrast, for example, the use of sodium acrylate, potassium acrylate or ammonium acrylate in place of lithium acrylate has been found to give hazy or cloudy films, sometimes tacky, even though the corresponding photopolymerizable solutions have been clear.

The exposure time may be readily determined by routine testing, as is well known in the art, and will vary according to the intensity of the exposing radiation, the distance from the object to the photopolymerizable element, the photosensitizer concentration, and similar factors. These factors may be varied as necessary to change the exposure duration, either shorter or longer, as desired to obtain the optimum combination of exposure duration and light intensity for a given photopolymerizable composition and application. Where the exposure is to a laser to form a volume phase hologram, a subsequent non-imagewise or flood exposure to white light is useful to fix the photopolymerizable layer.

The thickness of the photopolymerizable composition is not particularly critical and may be selected accordingly to the intended use, as is well known in the art. In general, the dry thickness of a coated film will be about 2-10 microns, although coatings may be as thick as 25-30 microns for certain applications. The support may be rigid, e.g., glass, or flexible, e.g., polyester film base, and preferably is transparent. Furthermore, the support may be flat or curved.

Coating may be effected by spin coating, slot coating or curtain coating. Where it is desired to use a flexible support of low birefringence, e.g., surface hydrolyzed cellulose triacetate film base, such a coated film may be laminated to a glass plate with the photopolymerizable coating outermost. Such a construction provides the benefits of continuous coating technology and rigidity during exposure, as well as avoiding exposure of the film base to solvents used in the various processing solutions, particularly where such solvents might adversely affect the flatness or dimensional stability of the film base.

Where desired to facilitate smooth and uniform coating, the coating composition may contain wetting agents or solvents adapted to aid coating. The particular additive may vary depending upon the coating conditions and the support being coated. Lower alcohols such as 2-propanol are useful in certain applications. As examples of wetting agents which have been found useful in coating lithium acrylate photopolymerizable compositions where it is desired to minimize alcohol content, mention may be made of surfactants such as Fluorad 120 and Corfax 712. (Fluorad 120 is available from 3M Co., St. Paul, Minn. Corfax 712 is a surfactant based on a low nolecular weight polyethenimine attached to a long chain hydrocarbon, and is commercially available from Cordova Chemical Co. of Michigan, North Muskegon, Mich.; it is said to have a molecular weight of 486.)

It is a unique characteristic of the photopolymerizable lithium acrylate compositions of the preferred embodiment of this invention that they are photosensitive only when "moist", and that when "dry" they may be stored for extended periods and rendered photosensitive again simply by humidifying for a short time. Thus, the freshly coated photopolymerizable composition is air dried to remove water and low boiling organic solvents present, e.g., 2-propanol, and prior to use is stored over a desiccant or in a sealed package, preferably light tight, of the type having a moisture barrier to prevent changes in the humidity within the sealed package. Shortly prior to use, the dry photopolymerizable element may be activated by being placed in a humidity chamber (preferably about 51% R.H.) to equilibrate. The branched polyethylenimine is hygroscopic and will rapidly absorb moisture. The humidified photopolymerizable composition remains a coated film but contains sufficient moisture to provide a "semi-fluid" medium for photopolymerization. This characteristic facilitates the lateral diffusion of monomer within the coating from areas of no exposure to adjacent exposed areas where polymerization is occuring during the image exposure, thereby resulting in a higher concentration of "monomer" units in exposed than unexposed areas. Since photopolymerization gives an increase in the index of refraction, this lateral diffusion or migration and consequent concentration change is effective to increase the delta in index of refraction between exposed and unexposed areas.

After the image and flood exposures, the imaged element may be intensified by treatment with 2-isopropanol. The dried imaged element may then be sealed to a transparent, substantially moisture-impermeable cover such as a microscope glass plate. A suitable adhesive is an alpha-cyanoethyl acrylate type adhesive, such as "Eastman 910" (Eastman Kodak Co., Rochester, N.Y.). In a preferred embodiment, the imaged element is treated with an alcoholic solution of a zirconium compound, e.g., zirconium acetate, zirconyl nitrate or zirconyl chloride. The resulting cross-linked imaged element is highly resistant to moisture, thus eliminating the need in many instances to seal the imaged element to a moisture-impermeable cover.

In the preferred embodiments of this invention, and particularly in those embodiments concerned with forming a volume hologram, a small quantity of an inert, compatible polymer also is present to give a low viscosity, high solids solution for coating. Poly-N-vinylpyrrolidone is preferred for this use.

It will be understood that the photopolymerizable compositions are prepared, coated and handled prior to use in the absence of light of wavelengths absorbed by the dye sensitizer, e.g., under safelight conditions.

The following examples are given for the purpose of illustration and are not intended to be limiting.

EXAMPLE 1

A photosensitive element was prepared as follows: a premix aqueous solution of polyethylenimine was prepared comprising Corcat P-600 branched polyethylenimine (mol. wt. 40–60,000), 2-propanol, and p-methoxyphenol in water. This solution was mixed with an aqueous solution of poly-N-vinyl pyrrolidone (30% solids; Plasdone C-15, GAF, Inc.), a solution of methylene bisacrylamide in 2-propanol and water, an aqueous methylene blue solution, acrylic acid containing a small amount of p-methoxyphenol polymerization inhibitor, lithium acrylate and water to give a coating solution having the following composition (weight percent):

| | |
|---|---|
| Acrylic acid | 1.48 |
| p-methoxyphenol | 0.00448 |
| Lithium acrylate | 18.8 |
| Water | 64.46 |
| 2-propanol | 1.56 |
| Corcat 600 | 5.06 |
| Methylene bisacrylamide | 0.135 |
| Poly-N—vinyl pyrrolidone | 8.45 |
| Methylene blue | 0.0426 |

The above coating solution was spin coated on 2 inch square glass slide covers to a dry thickness of about 5 microns. The coated glass slides were air dried and stored over Drierite.

EXAMPLE 2

A coated glass slide prepared as described in Example 1 was prepared for use by incubating at 51% R.H. for 25 minutes. The coated glass slide was slightly cloudy when removed from the dry box but was clear after the humidity incubation. A transmission hologram suitable for use as a holographic lens was made in a standard laser holographic set-up with lenses in front of the exposure plane so that the object beam (converging to a focal point behind the exposure plane) and the reference beam (diverging) each made a circle having a 4.0 mm diameter at the exposure plane, with the two circles overlapping and covering the same area. The variable beam splitter was adjusted so that the first order intensity of each of the object and reference beams at the exposure plane was 0.6 mw/cm$^2$ with the angle between the beams being 52°. Two laser exposures of 4 and 8 seconds each using a He:Ne laser (633 nm) were made on the coated glass slide, at opposite corners, each through the glass. Without removing it from the exposure plane, the exposed slide was flood exposed for 2 minutes with a reflector-mounted 60 w bulb. The resulting plate was optically clear with information recorded as a modulation of refractive index. A good quality image, closely matching that from the original beam, was obtained when the image was reconstructed by the reference beam using the thus-obtained hologram. A very good quality Airy disk (a diffraction pattern consisting of a bright central disk surrounded by a number of fainter rings) was observed using a horizontally mounted microscope with a 10× eyepiece and a 20×objective. The slide was then washed in 2-propanol at room temperature and then dried by spinning the slide and blowing filtered compressed air on it.

EXAMPLE 3

The procedure described in Example 2 was repeated, with a single 8 second laser exposure. After the 2-propanol wash, the slide was treated with 2-propanol vapors by being held over boiling 2-propanol for one minute. The image was somewhat brighter after the 2-propanol wash and much brighter after the 2-propanol vapor treatment. A heavy cover glass was glued onto the image using an α-cyanoethyl acrylate glue. The diffraction efficiency of the hologram was found to be 47%.

EXAMPLE 4

A coating mixing similar to that described in Example 1 was prepared having the following composition:

| | |
|---|---|
| Acrylic acid | 0.099 g. |
| Lithium acrylate | 1.250 g. |
| Water | 0.900 g. |
| Poly-N—vinyl pyrrolidone (30% solids) | 1.875 g. |
| Methylene blue solution (6.40 g. methylene blue in water to make 1000 ml.) | 0.684 g. |
| Methylene bisacrylamide solution (0.040 g. methylene bisacrylamide, 0.400 g. 2-propanol and .560 g. water) | 0.245 g. |
| Corcat P-600 solution (4.26 g. water, 0.943 g. Corcat P-600 branched polyethylenemine, 0.0078 g. p-methoxyphenol, and 0.039 g. 2-propanol) | 1.875 g. |

This coating mix was spin coated onto glass slides to a dry thickness of about 5 microns to provide a series of coated slides which were exposed to a He:Ne laser (total intensity 10 mw/cm$^2$) as in Example 2 for 1, 2, 3, 5, 7 and 10 seconds each. After the laser exposure, each exposed slide was fixed by flood exposure, and then washed for one minute in an alcoholic solution of 5% zirconium acetate at about 48° C. The slide then rinsed in a beaker of 38° C. 2-propanol, followed by a squeeze-bottle applied rinse of room temperature 2-propanol, after which it was held for two minutes over boiling 2-propanol. The reconstructed object beam data was as follows:

| Exposure Time (seconds) | Diffraction Efficiency |
|---|---|
| 1 | 46% |
| 2 | 60% |
| 3 | 60% |
| 5 | 60% |
| 7 | 64% |
| 10 | 58% |

The Airy disk obtained in the 1, 2, 3 and 10 second exposures was of very good quality.

As noted above, the branched polyethylenimine is effective in photopolymerization systems in which the photopolymerizable solution or fluid is contained between spaced apart glass slides. The following examples illustrate this use.

EXAMPLE 5

A solution of acrylic acid, Corcat P-600 branched polyethylenimine, sodium riboflavin-5-phosphate and tetraethylene glycol dimethacrylate between glass plates was exposed to two overlapping laser beams using an argon ion laser (488 nm). The resulting grating image had a resolution of 2500 lines/mm.

EXAMPLE 6

A solution of lithium acrylate, Corcat P-600 branched polyethylenimine, N,N'-methylene bisacrylamide and methylene blue between glass plates was exposed to two overlapping laser beams using a He:Ne laser (633 nm) to make a holographic grating image.

As noted above, derivatized polyethylenimines may be used as the branched polyethylenimine. Dow PEI 600E hydroxyethylated polyethylenimine (prepared by reaction of ethylene oxide and branched polyethylenimine was less effective than Corcat P-600, and tended to give cloudy coatings. Lower molecular weight versions of Corcat P-600 branched polyethylenimine, e.g., Corcat P-100 mol. wt. 10–20,000, Corcat P-18 mol. wt, 1800 and Corcat P-12 mol. wt. 1200 all were effective but not as effective as Corcat P-600, whereas higher molecular weight Corcat P-2500 mol. wt. 250,000 gave an undesirably viscous mixture difficult to coat.

When triethanolamine was used in place of Corcat P-600 branched polyethylenimine with lithium acrylate, the resulting coating had weak sensitivity and the processed coating was very white. Weak sensitivity also was observed when triethanol amine was used in a solution containing lithium acrylate.

The following experiments compare linear polyethylenimine with branched polyethylenimine as a photopolymerization initiator:

COMPARISON EXAMPLE A

Poly-(2-ethyl-2-oxazoline) was 59% hydrolyzed to give a linear polyethylenimine in which 41% of the nitrogens were substituted by

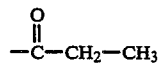

(amide groups). (This polymer is hereinafter referred to as "59% hydrolyzed PEO".) A premix aqueous solution was prepared by mixing 3.42 g. of a 27.6% aqueous solution of said 59% hydrolyzed PEO, 2.34 g. of water and 0.05 g. of a 2% solution of p-methoxyphenol in 2-propanol, and the pH of this solution was adjusted to about 10 by addition of 15 drops of 16.7% aqueous NaOH. 0.544 g. of this premix solution was mixed with 0.25 g. of acrylic acid, 0.279 g. of lithium acrylate, 0.05 g. of a methylene bisacrylamide solution (0.04 g. methylene bisacrylamide, 0.4 g. of 2-propanol and 0.56 g. of water), 0.15 g. of a 50% aqueous solution of triphenylsulfonium chloride and 0.1 g. of methylene blue solution (3.2 g. of methylene blue in water to make 1000 ml.). The resulting coating solution was fluid and very clear. A few drops of this coating solution was placed between glass slides to form a sandwich. Exposure of this sandwich to an Itek test target using red-filtered light from a Polaroid slide projector for 90 seconds did not give a visible image; a subsequent 3 minute white light flood exposure made the coating cloudy and a weak blurry image in the cloudy coating. Laser exposures of 8, 16, 32, 60 and 90 seconds to a 6 mm. spot from a He:Ne laser (633 nm) gave no sign of an image. No bleaching of the methylene blue dye was observed in any of these exposures. This procedure was repeated using a second coating fluid made by adding to the remaining first coating fluid about half its volume of the 59% hydrolyzed PEO premix in order to increase the linear polyethylenimine content. There was no observable effect when a sandwich of this second coating fluid between glass plates was exposed for 90 seconds to red-filtered light from the slide projector. No bleaching of the methylene blue dye was observed in this test either.

COMPARISON EXAMPLE B

Poly-(2-ethyl-2-oxazoline) was 93% hydrolyzed to give a linear polyethylenimine in which 7% of the nitrogens were substituted by

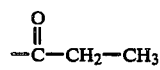

(amide groups). (This polymer is hereinafter referred to as "93% hydrolyzed PEO".) A premix aqueous solution was prepared by mixing 3.42 g. of a 38% aqueous solution of said 93% hydrolyzed PEO, 1.50 g. of water and 0.05 g. of a 2% solution of p-methoxyphenol in 2-propanol, and the pH of this solution was adjusted to 8.0–8.5 by the addition of 16.7% aqueous sodium hydroxide. This solution was stirred overnight to give a clear, near-orange colored solution. 0.75 g. of this premix solution was mixed with 0.25 g. of acrylic acid, 0.28 g. of lithium acrylate, 0.05 g. of a methylene bisacrylamide solution (0.04 g. of methylene bisacrylamide, 0.4 g. of 2-propanol and 0.56 g. of water), 0.15 g. of a 50% aqueous solution of triphenylsulfonium chloride and 0.1 g. of methylene blue solution (3.2 g. of methylene blue in water to make 1000 ml.) Laser exposures of this fluid sandwiched between glass plates gave no sign of an image after 8, 16, 32 and 60 seconds exposure to a 6 min. spot from a He:Ne laser. A subsequent 3 minute white light exposure using a Polaroid slide projector made the coating slightly cloudy without an image.

In view of the fact that test coatings in the above Comparison Examples A and B were alkaline, the linear polyethylenimine also was tested under acidic conditions.

COMPARISON EXAMPLE C

Test Sample A was prepared by mixing 2.0 g. of acrylic acid, 0.10 g. of tetraethyleneglycol dimethacrylate, 0.05 g. of a 0.4% aqueous sodium riboflavin-5-phosphate and 1.79 g. of a 27.6% aqueous solution of 59% hydrolyzed PEO. Test Sample B was prepared in the same manner except 2.50 g. of the 27.6% aqueous solution of 59% hydrolyzed PEO was added. Test Sample C was prepared in the same manner substituting 1.72 g. of a 38% paste of 93% hydrolyzed PEO; the paste did not dissolve. A control Sample D was prepared in the same manner using 1.50 g. of a 33% aqueous solution of Corcat P-600 branched polyethylenimine. Each of the test samples was placed in a test tube with a thermocouple attached and exposed at room temperature to white light from a Polaroid slide projector. The temperature increase of each test sample as a function of the duration of the exposure was measured as follows:

| Test Sample | Polyethylenemine | Exposure Time | ΔT° |
|---|---|---|---|
| A | 59% Hydrolyzed PEO | 6 min. | nil |
| B | 1.4X 59% Hydrolyzed PEO | 3 min. | nil |
| C | 93% Hydrolyzed PEO | 5 ½ min. | nil |
| D | Corcat P-600 branched | 40 seconds | >46° C. |

(A very slight temperature rise observed with Test Samples A, B and C was attributed to the warming effect of the projector light, and the ΔT° was therefore considered to be nil.) The lack of a temperature rise with the linear polyethylenimine Test Samples A, B and C showed that photopolymerization did not occur, whereas it did with the branched polyethylenimine.

In view of the above comparison examples, linear polyethylenimine is considered to be ineffective as a photopolymerization initiator, whereas the branched polyethylenimine is highly effective.

Coatings of the type prepared in Example 4 have been found to have very good shelf life. When stored dry at 3° C. and then humidified before use, such coatings were found to be useful for He:Ne laser imaging after more than 9 months dry storage, and for He:Cd laser imaging after 3 months dry storage. Such coatings have been found to give very high resolution images; reflection holograms made with He:Ne laser exposure have been made with resolution of about 4,700 lines/mm, while gratings made with He:Cd laser imaging have exhibited resolution greater than 3200 lines/mm.

Holograms made using the preferred embodiment of this invention include diffraction gratings made with He:Ne, Argon ion and He:Cd lasers, reflection holograms using He:Ne lasers and rainbow holograms using He:Ne lasers.

As noted above, the combination of a branched polyethylenimine, lithium acrylate and methylene blue, as exemplified by Example 4, has been found to be highly sensitive, with exposures as short as 5–10 mj/cm$^2$ being sufficient to obtain high diffraction efficiency transmission holograms. Exposures of 30 mj/cm$^2$ have given bright reflection holograms. Of special significance is the fact that such films exhibit very little sensitivity to oxygen and they therefore may be used in the presence of atmospheric oxygen. Refraction index modulation of 0.03 has been obtained with such films.

Humidification of coated photopolymerizable elements of the type illustrated in Example 4 may be as short as 1.5 to 2 minutes, with longer times, e.g., up to 2 hours, being acceptable. In general, the relative humidity for humidification of the dry coating preferably is about 47 to 51% RH, although active coatings can be obtained at somewhat higher or lower relative humidities. Very low relative humidity, e.g., 33%, and very high relative humidity, e.g., 79%, do not activate the films. The photopolymerizable element should be exposed as soon as possible after activation by the humidification treatment. It is desirable that the moisture content of the activated coating remain substantially unchanged during the image and flood exposures.

The above described treatment of the photopolymer image with zirconium compounds has been found to be very effective in stabilizing the image against physical change, i.e., swelling or shrinking. Holographic images stabilized with zirconium acetate have been found to exhibit no significant decrease in diffraction efficiency unless subjected to very high relative humidity, e.g., about 85% or higher, for prolonged periods of days or weeks. A particularly useful technique for effecting the zirconium acetate treatment is to immerse the imaged element in a bath of zirconium acetate, acetic acid, methanol and water for about 1 minute at room temperature with agitation. The zirconium acetate concentration may be about 5 to 20%. The currently preferred concentrations are 10% zirconium acetate, 4% acetic acid, 20% water and 66% methanol. The methanol:water ratio may be varied to control the swelling or shrinking of the photopolymer image as may be desired, and all of the water may be replaced by methanol. The acetic acid is present to prevent hydrolysis of the zirconium acetate. The zirconium acetate-treated image is rinsed with 2-propanol at room temperature. Drying of the rinsed image is preferably effected with heat, e.g., with a heat gun or by holding in hot 2-propanol vapors for about 30–120 seconds, to avoid pick up of water when the 2-propanol is removed.

If additional resistance is desired to changes induced by high humidity, the zirconium acetate treated material may be treated with a fatty acid to form a reaction product with the zirconium. This stabilization process is disclosed and claimed in the copending application of Richard T. Ingwall and Herbert L. Fielding, Serial No. 641,994, (now U.S. Pat. No. 4,535,041 issued Aug. 13, 1985), filed concurrently herewith.

It is believed that the fatty acid reacts with the zirconium to form a product of the type referred to in the literature as a zirconium soap.

The particular acid employed does not appear to be critical, and beneficial effects have been obtained with typical fatty acids, e.g., stearic, lauric, palmitic, myristic and oleic acids. Monocarboxylic acids as short as three and four carbons have been reported to give water-insoluble zirconium compounds. While such shorter chain acids may be considered to be fatty acids for the purposes of this use since they give hydrophobic zirconium salts, it is preferred to use acids having longer alkyl chains, e.g., at least eight carbons, to obtain the extra hydrophobicity. The fatty acid preferably is employed as a solution in an organic solvent, e.g., isopropanol or xylene.

The quantity of zirconium and fatty acid incorporated in the hologram is not critical, provided that it is sufficient to be effective in increasing the stability of the hologram to humidity.

The following examples illustrate this stabilization process.

EXAMPLE 7

A photopolymerizable composition similar to that used in Example 4 above was spin coated on to a 2 inch square glass slide cover to a dry thickness of about 5 microns. This slide was incubated at about 51% R.H. to activate it prior to being imaged with a He:Ne laser to provide a transmission holographic grating. The laser-exposed slide then was given a white light flood exposure and then soaked for about a minute in a solution of 10% zirconium acetate, 4% acetic acid, 20% water and 66% methanol, rinsed in 2-propanol, and then was soaked for 5 minutes in isopropanol containing 5% stearic acid. After rinsing in isopropanol and drying over isopropanol vapors, the hologram exhibited greatly improved water resistance and retained its image even when immersed in water. The treated hologram also had improved abrasion resistance. There was no apparent change in the optical properties of the hologram.

EXAMPLE 8

A series of transmission holographic gratings were prepared as described in Example 7 through the step of treating with zirconium acetate and rinsing. The thus-treated slides were soaked in 5% xylene solutions of a fatty acid for 20 minutes at room temperature, washed in isopropanol and dried over isopropanol vapors. The diffraction efficiency of each slide was measured before and after the fatty acid treatment, and again 24 and 48 hours after the fatty acid treated slides were held at 95% R.H. at room temperature. A control slide was given the zirconium acetate treatment but not the fatty acid treatment. The following results were obtained:

| | % Diffraction Efficiency | | | |
|---|---|---|---|---|
| Fatty Acid | Initial | After Fatty Acid | 24 hr 95% RH | 48 hr 95% RH |
| Stearic | 84 | 75 | 82 | 77 |
| Lauric | 84 | 72 | 78 | 77 |
| Palmitic | 80 | 72 | 72 | 72 |
| Myristic | 77 | 72 | 75 | 77 |
| Oleic | 77 | 69 | 75 | 77 |
| Control | 73 | — | 4 | 2 |
| Stearic plus 0.1% Corfax 712 | 84 | 77 | 78 | 77 |

EXAMPLE 9

Another set of transmission holographic gratings were prepared as described in Example 8. These holograms were treated for 10 minutes in boiling 5% xylene solution of fatty acid and then allowed to cool in the fatty acid solution for 10 minutes. The following results were obtained in the same type of incubation study:

| | % Diffraction Efficiency | | | |
|---|---|---|---|---|
| Fatty Acid | Initial | After Fatty Acid | 24 hr 95% RH | 48 hr 95% RH |
| Stearic | 80 | 75 | 78 | 80 |
| Lauric | 80 | 75 | 78 | 77 |
| Palmitic | 80 | 75 | 78 | 77 |
| Myristic | 73 | 69 | 72 | 75 |
| Oleic | 80 | 75 | 82 | 77 |
| Stearic plus 0.05% Corfax 712 | 73 | 72 | 75 | 75 |

EXAMPLE 4

A series of reflection holograms were prepared by the procedure described in Example 2 and soaked for 20 minutes at room temperature in 5% xylene solutions of oleic, lauric, stearic, palmitic and myristic acids. The treated holograms and an untreated control reflection hologram were incubated for 24 hrs. at 95% R.H. Transmission spectra showed a shift in the transmission minimum to the blue region after 24 hrs., but with no further shift with time. The diffraction efficiency of the treated holograms, as inferred from the percent transmission at the minimum of each spectrum, was substantially unchanged after incubation, whereas the control hologram was almost completely destroyed.

As noted above, the novel photopolymerizable compositions of this invention are useful in forming various holographic elements. Indeed, the dye-sensitized photopolymerizable coated films containing lithium acrylate and a branched polyethylenimine have been found to be very useful in forming a holographic multiplexer/demultiplexer, e.g., of the type described in U.S. Pat. No. 4,359,259 issued Nov. 16, 1982 to Horner et al. These compositions also are contemplated for use as the holographic component of the optical components described in the commonly assigned copending application of William T. Plummer, Ser. No. 479,489 filed Mar. 28, 1983 (now abandoned in favor of continuation application, Ser. No. 754,127 filed July 12, 1985). The holographic elements may be used as narrow band filters in laser protection optics and in head up display optics.

While the invention has been described in detail and with reference to specific embodiments thereof, it will be apparent to one skilled in the art that various changes and modifications can be made therein without departing from the spirit and scope thereof.

What is claimed is:

1. A photopolymerizable composition comprising an ethylenic unsaturated monomer, a dye sensitizer, and a branched polyethylenimine, said dye sensitizer and said branched polyethylenimine providing a photopolymerization initiation system.

2. A photopolymerizable composition as defined in claim 1 wherein at least 20% of the nitrogens in said branched polyethylenimine are tertiary nitrogens.

3. A photopolymerizable composition as defined in claim 1 wherein said dye sensitizer is methylene blue.

4. A photopolymerizable composition as defined in claim 1 wherein said ethylenic unsaturated monomer is a monovalent salt of acrylic acid.

5. A photopolymerizable composition as defined in claim 4 wherein said ethylenic unsaturated nonomer is lithium acrylate.

6. A photopolymerizable composition as defined in claim 5 further including poly-N-vinyl pyrrolidone.

7. A photopolymerizable element comprising a support carrying a layer comprising lithium acrylate, a branched polyethylenimine, a dye sensitizer and poly-N-vinyl pyrrolidone.

8. A photopolymerizable element as defined in claim 7 wherein at least 20% of the nitrogens in said branched polyethylenimine are tertiary nitrogens.

9. A photopolymerizable element as defined in claim 7 wherein said dye sensitizer is methylene blue.

10. A photopolymerizable element as defined in claim 9, including a second dye sensitizer effective to extend the sensitivity range of said methylene blue.

11. The method which comprises coating a support with a layer comprising lithium acrylate, a dye sensitizer, a branched polyethylenimine, and poly-N-vinyl-pyrrolidone, drying said layer, and storing said coated support in a low humidity environment whereby said lithium acrylate layer is maintained substantially non-photopolymerizable.

12. The method of claim 11 including the step of humidifying said lithium acrylate layer to render it photosensitive.

13. The method of claim 11 wherein said dye sensitizer is methylene blue.

14. The method of claim 11 wherein at least 20% of the nitrogens in said branched polyethylenimine are tertiary nitrogens.

15. The method of claim 14 wherein said branched polyethylenimine has a molecular weight of about 60,000.

16. The method of claim 14 wherein said branched polyethylenimine is hydroxyethylated polyethylenimine.

17. The method of claim 11 wherein said dye sensitizer is erythrosin.

18. The method of claim 11 wherein said dye sensitizer is eosin Y.

19. The method of claim 11 wherein said dye sentizer is sodium riboflavin-5-phosphate.

20. The method of claim 12, including the step of exposing said humidified lithium acrylate layer to radiation effective to initiate photopolymerization and form a photopolymer image in said layer.

21. The method of claim 11 wherein said lithium acrylate is present in a stoichiometric excess based upon the total nitrogens in the branched polyethylenimine.

22. The method of forming a photopolymer image which comprises imagewise exposing a photopolymerizable composition comprising an ethylenic unsaturated monomer, a dye sensitizer and a branched polyethylenimine to light absorbed by said dye sensitizer, said dye sensitizer and said branched polyethylenimine providing a photopolymerization system, thereby effecting imagewise photopolymerization of said monomer.

23. The method of claim 22 wherein at least 20% of the nitrogens in said branched polyethylenimine are tertiary nitrogens.

24. The method of claim 22 wherein said dye sensitizer is methylene blue.

25. The method of claim 22 wherein said dye sensitizer is sodium riboflavin-5-phosphate.

26. The method of claim 22 wherein said ethylenic unsaturated monomer is a monovalent salt of acrylic acid.

27. The method of claim 26 wherein said ethylenic unsaturated monomer is lithium acrylate.

28. The method of claim 27 wherein said photopolymerizable composition includes poly-N-vinyl pyrrolidone.

29. The method of claim 28 wherein said photopolymerizable composition is a coated layer on a support.

30. The method of claim 29 wherein said imagewise exposure is effected by a laser.

31. The method of claim 30 wherein said photopolymer image is a hologram.

32. The method of claim 22, including the step of stabilizing said photopolymer image by treating it with a solution of zirconium acetate.

33. The method of claim 27 wherein said lithium acrylate is present in a stoichiometric excess based upon the total nitrogens in said branched polyethylenimine.

34. The method of claim 29 including the step of stabilizing said photopolymer image by treating it with a solution of zirconium acetate.

35. The method of claim 22 including the step of uniformly exposing said photopolymerizable composition subsequent to said imagewise exposure.

36. The method of claim 30 including the step of uniformly exposing said photopolymerizable composition to white light subsequent to said imagewise exposure.

37. The method of claim 34 wherein said zirconium compound is zirconium actate.

* * * * *